United States Patent [19]
Davies et al.

[11] Patent Number: 6,103,866
[45] Date of Patent: Aug. 15, 2000

[54] X-RAY LITHOGRAPHY RESISTS

[75] Inventors: Jack D. Davies; William H. Daly, both of Baton Rouge, La.

[73] Assignee: Board of Supervisors of Louisiana State University and Agricultural and Mechanical College, Baton Rouge, La.

[21] Appl. No.: 09/268,506

[22] Filed: Mar. 11, 1999

Related U.S. Application Data

[62] Division of application No. 08/757,218, Nov. 27, 1996, Pat. No. 5,922,518
[60] Provisional application No. 60/112,021, Dec. 5, 1995, abandoned.

[51] Int. Cl.$^7$ .................................................. C08G 75/20
[52] U.S. Cl. ...................... 528/382; 528/373; 480/322; 480/967; 378/34; 378/62; 378/64
[58] Field of Search .................... 528/382, 373; 430/322, 967; 378/34, 62, 64

[56] References Cited

U.S. PATENT DOCUMENTS

| | | | |
|---|---|---|---|
| 3,935,331 | 1/1976 | Poliniak et al. | 427/43 |
| 4,097,618 | 6/1978 | Poliniak | 427/41 |
| 4,267,257 | 5/1981 | Poliniak et al. | 430/270 |
| 5,364,739 | 11/1994 | Robillard | 430/292 |
| 5,458,254 | 10/1995 | Miyagawa et al. | 216/27 |
| 5,846,727 | 12/1998 | Aper et al. | 435/6 |

OTHER PUBLICATIONS

Polymer Letters vol. 9, pp. 901–956 (1971) Ivin et al.
Florjańczyk, Z. et al., "Reactivity of Vinyl Monomers in the Copolymerization and Terpolymerization with Sulfur Dioxide,"Makromol. Chem., vol. 188, pp. 2811–2820 (1987).

Ivin, K. et al., "Structure of the Polysulfones of Some Conjugated Dienes," Poly. Lett., vol. 9, pp. 901–906 (1971).

Matsuda, M. et al., "Radical Copolymerization of Sulfur Dioxide and Chloroprene," J. Poly. Sci. A–1, vol. 10, pp. 837–843 (1972).

Minoura, Y. et al., "Polymerization of Butadiene Sulfone," J. Poly. Sci. A–1, vol. 4, pp. 2929–2944 (1966).

Reichmanis, E. et al., "Polymer Materials for Microlithography," Chem. Rev., vol. 89, pp. 1273–1289 (1989).

Thompson, L.F. et al., "A New Family of Positive Electron Beam Resists—Poly (Olefin Sulfones)," J. Electrochem. Soc.: Solid–State Science and Technology, vol. 120, pp. 1722–1726 (1973).

*Primary Examiner*—Duc Truong
*Attorney, Agent, or Firm*—John H. Runnels

[57] ABSTRACT

Poly (diene sulfones) have superior properties as X-ray resists. Many poly (diene sulfones) have an X-ray sensitivity below about 50 mJ/cm$^2$, and a glass transition temperature above about 70° C. A preferred X-ray resist is poly (1,3-hexadiene sulfone). A method of synthesizing poly (diene sulfones) is disclosed, in which a diene monomer is dissolved in a molar excess of a nitroalkane at low temperature, for example in a molar excess of dried 2-nitropropane in a −78° C. dry ice/acetone bath, and reacted with a molar excess of sulfur dioxide in the presence of a free radical initiator such as tert-butyl-hydroperoxide.

2 Claims, 6 Drawing Sheets

X-RAY LITHOGRAPHY RESISTS

This is a divisional of application Ser. No. 08/757,218, filed Nov. 27, 1996 now U.S. Pat. No. 5,922,518; which claims the benefit of the Dec. 5, 1995 filing date of provisional application Ser. No. 60/112,021 under 35 U.S.C., § 119(e); the entire disclosures of both of which are incorporated by reference.

This invention pertains to X-ray lithography resists.

X-ray lithography is a method for making structures and devices having very small dimensions, often less than one micron. Collimated X-rays are transmitted in a pattern onto a sensitive layer called an "X-ray resist," or simply a "resist." After exposure, the resist is developed with an appropriate developer, leaving a pattern of resist that is either a positive or a negative image of the X-ray pattern, depending on whether the resist used has a positive tone or a negative tone.

The resolution of a microstructure is the dimension, in a direction parallel to the structure's surface, of the smallest reproducible feature, or the smallest reproducible gap between adjacent features. The "aspect ratio" of a microstructure is the ratio of the depth of a feature to the resolution. High aspect ratios are desirable for many types of microstructures and microdevices, but high aspect ratios require a resist with good mechanical properties.

The most commonly used X-ray resist today is probably poly (methyl methacrylate) ("PMMA"). PMMA has good mechanical properties for manufacturing microdevices having a high aspect ratio, but PMMA has a relatively low sensitivity to X-rays.

Alkene-sulfone copolymers, poly (alkene sulfones) such as poly (1-butene sulfone), have been used in microlithography as positive X-ray or e-beam resists. These resists have higher sensitivity to X-ray radiation than the more commonly used PMMA, but have substantially poorer mechanical properties due to their relatively low glass transition temperatures.

A useful measure of a resist's mechanical properties is its glass transition temperature. It is desirable that an X-ray resist have a glass transition temperature above a temperature at which the solvent may readily be removed from the developed wafer, typically about 50° C. for the more commonly-used solvents. It is desirable that an X-ray resist have a sensitivity below about 200 mJ/cm$^2$.

E. Reichmanis et al., "Polymer Materials for Microlithography," Chem. Rev., vol. 89, pp. 1273–1289 (1989) presents a review of polymer chemistries that have been used in microlithography.

L. F. Thompson et al., "A New Family of Positive Electron Beam Resists—Poly (Olefin Sulfones)," J. Electrochem. Soc.: Solid-State Science and Technology, vol. 120, pp. 1722–1726 (1973) discloses the use of several poly (alkene sulfones) as resists in electron beam lithography.

The use of certain poly (alkene sulfones) as lithography resists is disclosed in U.S. Pat. Nos. 4,267,257; 4,097,618; and 3,935,331.

There is a continuing, unfilled need for X-ray resists having high X-ray sensitivity, high resolution, and good mechanical properties; i.e., having an X-ray sensitivity below about 200 mJ/cm$^2$, having a resolution smaller than about 0.3 µm, and having a glass transition temperature above about 50° C. To the inventors' knowledge, no previously reported X-ray resist satisfies all of these criteria.

Definition: unless specifically indicated to the contrary, both in this specification and in the Claims below the term "diene" refers to a molecule having at least one pair of conjugated carbon—carbon double bonds, for example a 1,3-diene or a 2,4-diene; wherein at least one such pair of conjugated carbon—carbon double bonds is not sterically constrained to be in a cis-type conformation relative to one another because of cyclic structures. The term "diene" does not exclude the possible presence of additional multiple bonds in a molecule, so long as at least one pair of conjugated carbon—carbon double bonds is present. A molecule that has two or more carbon—carbon double bonds, but that lacks a pair of conjugated carbon—carbon double bonds, would not be considered a "diene" under this definition. Furthermore, even a molecule having a pair of conjugated carbon—carbon double bonds is not considered to be a "diene" within the scope of this definition if all pairs of conjugated carbon—carbon double bonds in the molecule are sterically constrained to be in a cis-type conformation relative to one another because of cyclic structures. (See, e.g., monomers (7) and (8) in Table 1 below.)

Definition: unless specifically indicated to the contrary, in this specification the term "alkene" or "olefin" is used to denote a molecule having at least one carbon—carbon double bond, but lacking a pair of conjugated carbon—carbon double bonds. The terms "alkene" and "olefin" do not include a "diene" as "diene" is defined above. The terms "alkene" and "olefin" do, however, include a molecule that has two or more carbon—carbon double bonds, but that lacks a pair of conjugated carbon—carbon double bonds.

Conjugated dienes react with $SO_2$ to form poly (diene sulfones), generally 1:1 alternating copolymers of alkene subunits and —$SO_2$— subunits. Little has been reported on the physical properties of poly (diene sulfones).

K. Ivin et al., "Structure of the Polysulfones of Some Conjugated Dienes," Poly. Lett., vol. 9, pp. 901–906 (1971) discloses polysulfones synthesized from the following monomers: butadiene; isoprene; 2,3-dimethylbutadiene; 1,3-cyclohexadiene; 1,3-cyclooctadiene; and piperylene. The monomers were reacted with a free radical initiator at a temperature between −80° C. and −10° C. No solvent (other than $SO_2$ itself) was mentioned as being present during polymerization.

Y. Minoura et al., "Polymerization of Butadiene Sulfone," J. Poly. Sci. A-1, vol. 4, pp. 2929–2944 (1966) reports the synthesis of poly (butadiene sulfone). See also Z. Florjańczyk et al., "Reactivity of Vinyl Monomers in the Copolymerization and Terpolymerization with Sulfur Dioxide," Makromol. Chem., vol. 188, pp. 2811–2820 (1987).

M. Matsuda et al., "Radical Copolymerization of Sulfur Dioxide and Chloroprene," J. Poly. Sci. A-1, vol. 10, pp. 837–843 (1972) reports the synthesis of poly (chloroprene sulfone).

To the inventors' knowledge, the only poly (diene sulfones) that have ever previously been synthesized are those reported by Ivin et al., and the poly (chloroprene sulfone) reported by Matsuda et al. To the inventors' knowledge, it has never previously been suggested that any poly (diene sulfones) would be useful as X-ray resists. To the inventors' knowledge, the synthesis of poly (diene sulfones) in 2-nitropropane or other nitroalkanes has never previously been suggested.

It has been discovered that poly (diene sulfones) have superior properties as X-ray resists. It has been discovered that many poly (diene sulfones) have an X-ray sensitivity below about 50 mJ/cm$^2$, a glass transition temperature above about 70° C., and a resolution less than about 0.3 µm.

Novel conjugated diene/sulfone copolymers, such as 1,3-conjugated diene/sulfone copolymers, have also been discovered, polymers that are particularly useful as X-ray resists. A particularly preferred X-ray resist is the novel poly (1,3-hexadiene sulfone).

A novel method of synthesizing poly (diene sulfones) has also been discovered. A diene monomer is dissolved in dried 2-nitropropane or other nitroalkane at low temperature (preferably in a molar excess of the solvent), for example in a −78° C. dry ice/acetone bath. Sulfur dioxide is added to the reaction vessel (preferably in molar excess), along with a free radical initiator such as a hydroperoxide. The ensuing polymerization reaction produces a poly (diene sulfone).

Figure 1:
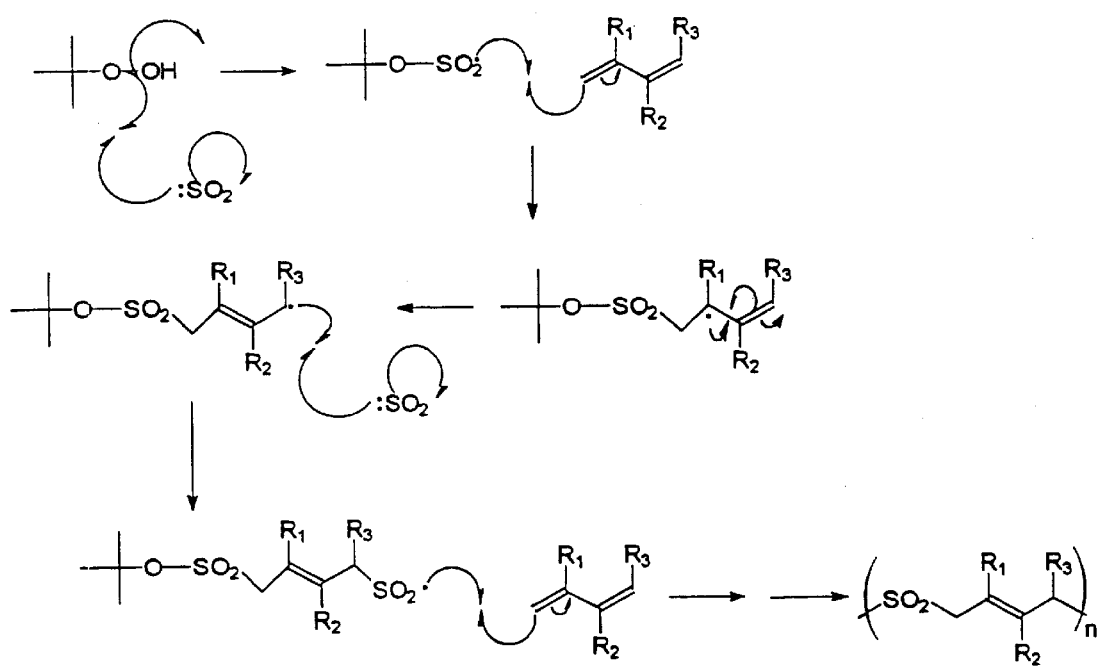
FIG. 1 illustrates an inferred mechanism for the polymerization reaction.

It is not thermodynamically possible to synthesize poly (diene sulfones) at temperatures above about −20° C., the typical ceiling temperature for the polymerization reaction. We have discovered that 2-nitropropane is a superior solvent for this polymerization reaction. Nitropropane is a liquid at the polymerization reaction temperatures; it is a solvent for many of the diene monomers; and it is a solvent for many of the diene-sulfone copolymer reaction products. (In a sense, the nitropropane/sulfur dioxide mixture is actually the solvent.) The melting point of nitropropane, −93° C., is well below the typical ceiling temperatures of these copolymers. Because this melting point is also well below the dry ice sublimation temperature of −78° C., a dry ice/acetone bath will often be a convenient means to achieve the desired reaction temperatures. Using nitropropane as a solvent allows the synthesis of poly (diene sulfones) from a wide range of diene monomers, including many monomers that would normally solidify at low temperature conditions, thus affording more homogeneous reaction conditions. Related solvents that will also work in this synthesis include nitromethane, nitroethane, 1-nitropropane, 2-nitrobutane, 1-nitrobutane, and other nitrated alkanes.

As examples, we have reacted each of the following diene monomers with $SO_2$ in nitropropane at dry ice temperatures: 1,3-hexadiene; piperylene; 3-methyl-1,3-piperylene; 1,3-butadiene; 1,3-cyclooctadiene; 2,4-dimethyl-1,3-pentadiene; 1,3-cyclopentadiene; 1,3-cyclohexadiene; trans-2-methyl-1,3-pentadiene; and isoprene. Other conjugated dienes such as 1,3-pentadiene; 1,3-heptadiene; 1-phenyl-1, 3-butadiene; 1,3-octadiene; and alkylated 1,3-octadienes will also be used, with longer alkyl substituents perhaps providing improved solubility or development characteristics.

Based upon NMR and elemental analyses, the polymers synthesized were determined to be primarily 1:1 alternating copolymers of 1,4-addition diene adducts. Thermal analysis found glass transition temperatures ("$T_g$'s") for these copolymers ranging from 70.0° to 85.6° C., a useful range for compounds used as X-ray resists.

Reagents

Piperylene; 3-methyl-1,3-piperylene; 1,3-butadiene; 1,3-cyclooctadiene; 2,4-dimethyl-1,3-pentadiene; 1,3-cyclopentadiene; 1,3-cyclohexadiene; trans-2-methyl-1,3-pentadiene; isoprene; tert-butylhydroperoxide; methanol; HPLC grade nitromethane; 2-nitropropane; magnesium sulfate; and sulfur dioxide were purchased from Aldrich Chemical Co. (Milwaukee, Wis.). The 1,3-hexadiene was purchased from Chemical Samples Co. (Columbus, Ohio).

Synthesis of Copolymers

All glassware was baked for 24 hrs at 150° C. prior to use. Monomers were used as received. The 2-nitropropane was dried over magnesium sulfate, filtered, and stored under argon. The copolymerizations of $SO_2$ and each of the various dienes occurred under generally similar conditions. The procedures described below for 1,3-hexadiene were representative of the procedures used for all dienes.

A 100 ml reactor, equipped with a magnetic stir bar, was charged with 4.5 ml (3.3 g) of 1,3-hexadiene and 15.5 ml (15.4 g) of 2-nitropropane, fitted with a stopper, and purged under dry argon for 30 minutes. The reactor was then placed in a dry ice/acetone bath and purged under dry argon for an additional 15 minutes. After the reactor had cooled to −78° C., 10.3 g of liquid $SO_2$ was added to the reactor, and the contents were mixed until homogeneous. A free radical initiator, 0.05 g of tert-butyl hydroperoxide dissolved in 5 ml of 2-nitropropane, was then added. (This free radical initiator was chosen because it retains activity at low temperatures. Alternatively, the free radical initiator may be, for example, a hydroxysulfite radical or an alkylsulfite radical.) The reaction was allowed to run until gelation was observed, about 10–30 minutes, at which point the mixture was warmed to room temperature. The gel was dissolved in 50 ml of nitromethane, and precipitated into 500 ml methanol. The precipitate was washed with copious amounts of methanol, filtered, and dried under vacuum for 48 hrs.

For all dienes polymerized, the preferred molar ratio of nitropropane:diene monomer in the reaction mixture was greater than 3:1. Likewise, the preferred molar ratio of $SO_2$:diene was greater than 3:1.

The polymerizations remained homogeneous until a relatively high degree of conversion was attained, with high molecular weights. A preferred molecular weight range is about 30,000 to about 150,000. The molecular weight should be large enough to permit stable films to be spun, but not so large that the polymer is difficult to process.

Diene monomers with limited solubility may be polymerized by this method into polymers having low ceiling temperatures, as was illustrated by the novel poly (diene sulfones) synthesized from 1,3-hexadiene; trans-2-methyl pentadiene; and 3-methyl pentadiene. By incorporating one or two methyl side groups into the polymer, solubility of the polymer in nitromethane was maintained.

Measurements

Inherent viscosities were determined at 25° C. for solutions of polymers (0.05 g/mL) in nitromethane, using an Ubbelohde viscometer (Cannon Instrument Co., State College, Pa.).

A Seiko (Torrance, Calif.) DSC 220C differential scanning calorimeter and a Seiko DMS 200 tensile modulator were used to determine $T_g$'s for the copolymers. $T_g$'s from differential scanning calorimetry at a heating rate of 10° C. per minute were taken as the midpoint of the change in slope of ΔE (in mJ/deg-mg) versus temperature, where ΔE denotes the energy, per degree per milligram, required to keep the sample at the same temperature as the reference as both are heated under the same conditions. $T_g$'s from dynamic mechanical spectroscopy ("DMS") were taken as the maximum of tan δ at 1 Hz. Degradation temperatures, $T_d$'s, were taken as the extrapolated intercepts of the baseline at the change in slope(s) of the baseline, found by thermogravimetric analysis using a Seiko (Torrance, Calif.) TG/DTA 220 thermobalance, at a heating rate of 5° C. per minute.

Proton NMR spectra were taken with Bruker (Billerica, Mass.) AC/WP200 and 400 FT NMR instruments in 5 mm o.d. sample tubes. Two-dimensional and $^{13}C$ DEPT measurements, taken at 90° and 130°, were made with a Bruker AC/WP200 NMR instrument. Heteronuclear correlation NMR ("HETCORR") and inverse $^1H$ and $^{13}C$ long range correlation coupling measurements, optimized at 7 Hz, were performed on a 400 FT NMR instrument. Deuterated chloroform or dimethylsulfoxide were used as solvents.

Infrared absorption spectra were measured on a Perkin Elmer (Norwalk, Conn.) 1760X spectrophotometer. Samples were prepared by pulverizing polymer with dry KBr, and pressing the mixture into a film. Spectra were taken from 500 to 3500 $cm^{-1}$ at a 5 $cm^{31}$ $^1$/sec scan rate. Cis:trans ratios were taken as the ratios of absorptions at 730 and 980 $cm^{-1}$, respectively.

Refractive indices were measured by casting a film of the sample from nitromethane onto the observation base of a Bausch and Lomb (Rochester, N.Y.) Abbé refractometer. Measurements were taken every 12 hours until three consecutive identical readings were obtained, with the final reading being the one reported. (Drying times were typically about 72 hours.)

Elemental analysis was determined for % C and H by Oneida Research Services (Whitesboro, N.Y.). Three readings were obtained for each sample, with the mean being reported.

Reaction Yields and Product Solubilities

Table 1 gives reaction yields and product solubilities for the polymerizations of several conjugated dienes with $SO_2$. Yields for non-cyclic 1,3-conjugated dienes were substantially higher than those for cyclic conjugated dienes.

In the "Solubility" column of Table 1, "C" denotes that the polymer was soluble in chloroform; "A," in acetone; "A*," in hot acetone; "T," in tetrahydrofuran; "D," in dimethylsulfoxide; "N," in nitromethane; and "I" denotes insolubility in each of these solvents. The "Number" column in Table 1 is a shorthand reference that is sometimes used below to refer to the monomer corresponding to that entry, and sometimes to the corresponding copolymer, depending on context.

TABLE 1

| Number | Monomer | Yield (%) | Solubility |
| --- | --- | --- | --- |
| 1 | (1,3-pentadiene) | 91 | C, A, T, D, N |
| 2 | (2-methyl-1,3-pentadiene) | 83 | C, N, D |
| 3 | (1,3-hexadiene) | 87 | N, D |
| 4 | (4-methyl-1,3-pentadiene) | 40 | C, A*, N, D |
| 5 | (2,4-dimethyl-1,3-pentadiene) | 56 | D |
| 6 | (1,3-butadiene) | 46 | I |
| 7 | (1,3-cyclohexadiene) | trace | — |
| 8 | (1,3-cyclooctadiene) | 0 | — |

These results, along with the NMR analysis, suggest that the conjugated dienes polymerized through 1,4-addition according to the mechanism illustrated in FIG. 1. The high solubility of the polymers (except for polymer (6)) suggested that cross-linking was not significant.

The steric hindrance of the propagating species can influence polymerization. As the double bond became progressively more hindered by alkyl substituents, the observed yield decreased. For example, the 1,3 hexadiene monomer had no substitution at the 1, 2, or 3 position, and gave the greatest polymerization yield. By contrast, cyclic monomers (7) and (8), which lock the diene in a cis-type conformation, failed to polymerize. (Recall that cyclic monomers (7) and (8) are not considered to be "dienes" within the scope of the definition given earlier, because their double bonds are sterically constrained to be in a cis-type conformation relative to one another.) (The poor yield for the butadiene-sulfone copolymer was attributed to decreased solubility of the polymer, resulting in precipitation during the reaction.)

Elemental Analysis

Table 2 reports elemental analyses for each of the copolymer products of the non-cyclic 1,3-conjugated dienes. The elemental analysis for each was consistent with the formation of a 1:1 copolymer. Except for polymer (5), the elemental analysis suggested a slight increase in the actual amount of $SO_2$ incorporated versus the theoretically expected amount. This observation is believed to be due to partial cyclization attributable to the high $SO_2$ molar ratios in the reaction mixtures.

TABLE 2

| Polymer | Theoretical % C | Theoretical % H | Observed % C | Observed % H | (Observed % C) - (Theoretical % C) |
|---|---|---|---|---|---|
| 1 | 49.29 | 6.89 | 48.51 | 6.82 | -0.78 |
| 2 | 49.29 | 6.89 | 47.17 | 6.49 | -2.12 |
| 3 | 45.44 | 6.10 | 45.16 | 6.12 | -0.28 |
| 4 | 49.29 | 6.89 | 44.42 | 6.29 | -4.87 |
| 5 | 45.44 | 6.10 | 48.69 | 6.72 | 3.25 |
| 6 | 40.66 | 5.12 | 39.14 | 5.26 | -1.52 |

Refractive Index and Viscosity

Copolymers (1)–(4) were soluble in nitromethane. Their inherent viscosities and refractive indices were therefore readily measured in that solvent. See Table 3.

TABLE 3

| POLYMER | REFRACTIVE INDEX | [η] dL/G |
|---|---|---|
| 1 | 1.537 | 1.98 |
| 2 | 1.547 | 0.51 |
| 3 | 1.541 | 0.98 |
| 4 | 1.541 | 0.86 |

Thermal analysis

Table 4 gives thermal analysis data for the various copolymers. $T_g$ denotes the glass transition temperature based on differential scanning calorimetry; $T_{d1}$, the temperature at which initial weight loss began; $T_{d2}$, the temperature at which the second weight loss began; and $T_{d3}$, the temperature by which substantially all weight had been lost.

For comparison, Table 4 also gives glass transition temperatures that we have measured for four olefinic-$SO_2$ copolymers. The abbreviations for these olefinic-$SO_2$ copolymers are as follows: PBS=poly (1-butene sulfone); PMPS=poly (2-methyl-pentene-1-sulfone); PCS=poly (cyclohexene sulfone); PNS=poly (norbornylene sulfone).

The thermal analysis data consistently showed substantially higher $T_g$'s for the diene copolymers than for olefinic-$SO_2$ copolymers. Without wishing to be bound by this theory, it is believed that this increase in glass transition temperature was due to a decrease in main chain bond rotation, a consequence of introducing a double bond into the main chain backbone. The $T_g$'s obtained from DMS analysis were similar (DMS data not shown).

TABLE 4

| POLYMER | $T_g$ °C. | $T_{d1}$ °C. | % WT LOSS at $T_{d1}$ | $T_{d2}$ °C. | % WT LOSS at $T_{d1}$ | $T_{d3}$ °C. |
|---|---|---|---|---|---|---|
| 1 | 70.0 | 116.6 | 2.8 | 166.2 | 38.2 | 290 |
| 2 | 73.3 | 135.2 | 3.1 | 168.7 | 51.7 | 261 |
| 3 | 71.4 | 107.1 | 1.9 | 202.3 | 48.1 | 280 |
| 4 | 82.9 | 150.7 | 4.6 | 219.0 | 45.2 | 270 |
| 5 | 82.8 | 159.2 | 6.9 | 226.5 | 45.4 | 297 |
| 6 | 85.6 | 252.6 | 15.0 | 308.6 | 68.6 | >360 |
| PBS | 28.8 | | | | | |
| PMPS | 22.5 | | | | | |
| PCS | 26.0 | | | | | |
| PNS | 33.2 | | | | | |

TG/DTA (thermal gravimetric/differential thermal analysis) showed two decomposition transitions, the first being consistent with a loss of $SO_2$, ~40% weight loss; and the second being complete thermal breakdown. The butadiene derivative (polymer 6) exhibited markedly higher initial and final decomposition temperatures, with more than a simple equimolar release of $SO_2$ at the first transition. This might be related to crystallinity effects, effects that could also account for this polymer's decreased solubility in common solvents.

NMR and IR Spectra

The structure of polymer 1, poly (1,3-hexadiene sulfone), is

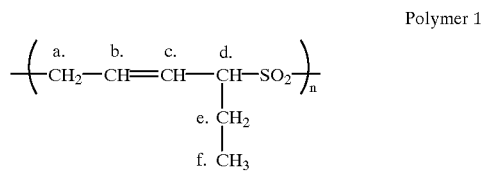

Polymer 1

Figure 2:
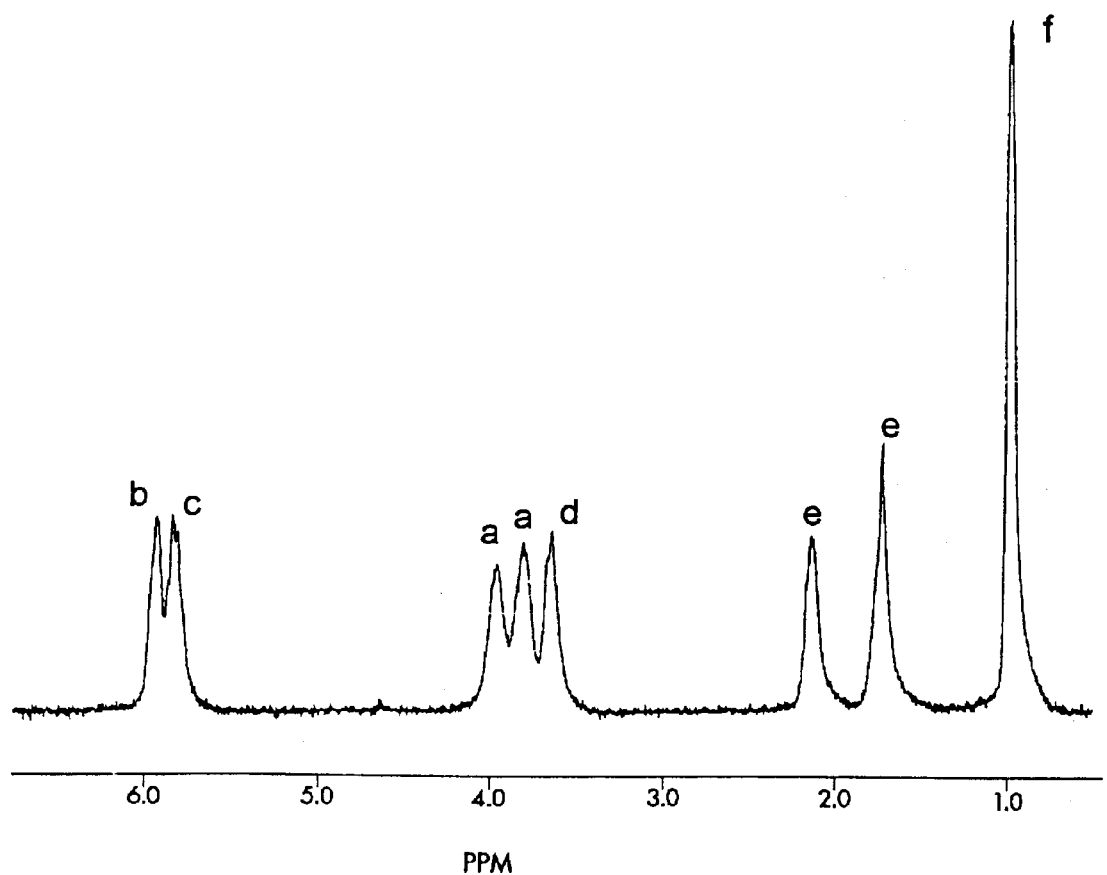
FIG. 2 illustrates the proton NMR spectrum for poly (1,3-hexadiene sulfone).

The proton NMR spectrum for polymer 1 is presented in FIG. 2. The 90° and 135° $^{13}C$ DEPT experiment (not shown) facilitated assignment of the resonances to the following groups: methines at 133.2, 126.4, and 67.5 ppm; methylenes at 53.9 and 19.5 ppm; and one methyl at 11.2 ppm.

Our interpretation of the HETCORR results, shown in Table 5, ascribed the proton shift at 0.97 ppm to the methyl group at 11.2 ppm in the carbon NMR. Methine groups for the 5.92, 5.79, and 3.66 ppm proton peaks were assigned to the carbon NMR peaks at 126.4, 133.2, and 67.5 ppm, respectively. Of interest was the splitting seen by the two methylene groups in the $^1H$ NMR spectra. Proton shifts at 1.75 and 2.14 ppm corresponded to the same methylene carbon. Similarly, the shifts at 3.83 and 3.96 ppm corresponded to a single methylene carbon. The corresponding peaks in the DEPT experiment were 19.5 ppm for the first methylene carbon, and 53.9 ppm for the second. Further investigation revealed that the protons labelled (e), at 1.75 and 2.14 ppm, were coupled to one another, so that the configuration of that carbon was fixed in a specific orientation. (This phenomenon was more difficult to observe for methylene group (a), partly because the coupling was smaller for these protons and was not as evident in the 2D NMR). This conclusion was further reinforced in that only one of the protons, that with a 1.75 ppm shift, was coupled with the methine group at (d). The proton at 2.14 ppm did not exhibit coupling except with the methyl group. This observation can be explained by a Karplus correlation, in which coupling decreases to zero as the dihedral bond angles of two groups approach 90°. It was inferred that the proton at 2.14 ppm was fixed at ~90° relative to the methine group at 3.66 ppm, and therefore showed negligible coupling to that group. This rigidity carried over to the main-chain of the polymer backbone, where splitting of the protons (a) was observed. This geminal splitting effect was attributed to the ethylene substituent, as similar splitting was not seen in the remaining poly (diene sulfones), none of which had a side group bulkier than methyl. Proton shifts were assigned to their respective carbon shifts by heteronuclear coupling. Assignments of the olefinic groups in Table 5 were determined by long range coupling at distances of two and three bonds. The proton shift at 5.92 ppm showed coupling to carbons at (a) and (d); whereas the proton shift at 5.79 ppm showed coupling to carbons at (a), (d), and (e), explained by assigning the latter to methine group (c). Because long range coupling was optimized at 7 Hz, and weak coupling was observed for methine group (d) and the 2.14 ppm proton on (e), little signal was produced by these species in the long-range coupling ("COLOC") experiment.

TABLE 5

| $^1$H shift (ppm) | HETCORR $^{13}$C shift (ppm) | COLOC $^{13}$C of interactive carbons (ppm) |
|---|---|---|
| 0.97 | 11.2 | 19.5, 67.5 |
| 1.75 | 19.5 | 11.2, 67.5, 133.2 |
| 2.14 | 19.5 | NA |
| 3.66 | 67.5 | 126.4, 133.2 |
| 3.83 | 53.9 | NA |
| 3.96 | 53.9 | 126.4, 133.2 |
| 5.79 | 133.2 | 19.5, 53.9, 67.5, 126.4 |
| 5.92 | 126.4 | 53.9, 67.5, 133.2 |

Similar NMR shifts were observed for the other soluble polymers (Table 6). However, the NMR spectra for polymers (2)–(5) displayed single peaks only, and did not show the splitting discussed above for polymer (1). It was thus inferred that the methyl substituents on these polymers possessed the rotational freedom to maintain an isotropic environment for their attached protons. In all cases the methylene peaks (a) were further upfield than would be the case in a comparable aliphatic compound, due to the strongly electrophilic, neighboring sulfone group.

TABLE 6

| | Proton Peak Shifts (ppm) | | | | |
|---|---|---|---|---|---|
| Polymer | "a" protons | "b" protons | "c" protons | "d" protons | "e" protons |
| 2 | 3.88 | 5.77 | 1.90 | 3.88 | 1.53 |
| 3 | 4.00 | 5.86 | 5.86 | 4.00 | 1.36 |
| 4 | 3.67 | 1.95 | 5.57 | 3.95 | 1.46 |
| 5 | 3.18 | 1.02 | 4.80 | 3.18 | N/A |

The polymers depicted in Table 6 have the following structures:

Polymer 2
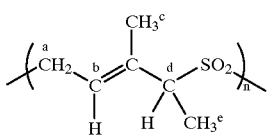

Polymer 3
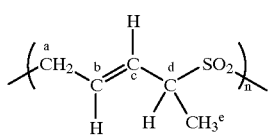

Polymer 4
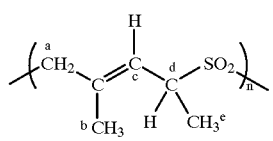

-continued

Polymer 5
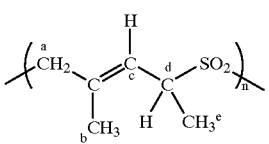

IR analysis, shown in Table 7, gave $SO_2$ peaks at ~1300 $cm^{-1}$ and ~1130 $cm^{-1}$ for each of the polymers. Cis percentages varied for the different polymers depending on their substituents. Polymers (2)–(5), with no ethyl substituents, had higher cis percentages, while the more sterically-hindered hexadiene-derived polymer (1) gave predominantly trans polymers. The fact that polymer (4), made from the trans 2-methyl pentadiene, produced a primarily cis conformation copolymer is further evidence for the proposed 1,4-addition mechanism depicted in FIG. 1.

TABLE 7

| POLYMER | $SO_2$ PEAKS $CM^{-1}$ | % CIS |
|---|---|---|
| 1 | 1313/1137 | 30 |
| 2 | 1313/1138 | 55 |
| 3 | 1300/1122 | 51 |
| 4 | 1299/1126 | 90 |
| 5 | 1305/1127 | 63 |

Poly (Diene Sulfones) as X-ray Resists

Poly (diene sulfones) such as those described above are useful as X-ray resists. A preferred resist is poly (1,3-hexadiene sulfone) ("PHS"). PHS has shown excellent X-ray resist properties in experiments conducted with the collimated X-ray source at Louisiana State University's J. Bennett Johnston Sr. Center for Advanced Microstructures and Devices. X-ray energies less than 100 $mJ/cm^2$ imparted a positive-tone, high resolution, readily developed image on PHS. The corresponding sensitivity for PMMA, the most widely used X-ray resist, is an order of magnitude higher, 1000 $mJ/cm^2$.

Excellent quality PHS films with thicknesses from 0.1 $\mu$m to 2.0 $\mu$m were spun on silicon wafers from nitromethane solutions (5% to 30% solutions, wt/wt) using standard techniques. (Thinner or thicker films could also readily be spun.) The films were initially spun onto a silicon wafer at 200 rpm until the wafer was covered. The spinning was then accelerated to 1000 rpm for 30–60 seconds. After spinning, the wafer was baked at 70° C. for thirty minutes prior to exposure. Films have also been spun of the poly (diene sulfones) of 1,3-pentadiene (=piperylene); 3-methyl pentadiene; and trans-2-methyl pentadiene; each cast from a nitromethane solution, but these films did not have the superior X-ray sensitivity and spinning qualities of the PHS film.

X-ray resists formed of the novel poly (diene sulfones) are particularly well-suited for making microstructures having high aspect ratios. Methods of making microstructures with high aspect ratios are disclosed, for example, in commonly-assigned international patent application PCT/US94/10164 by Vladimirsky et al.

Development of Exposed Poly (diene sulfones). Following is a description of the preferred method for developing exposed thin film layers of poly (diene sulfones), preferably poly (1,3-hexadiene sulfone). The polymer was coated onto a silicon wafer through spinning as described above, and was then exposed to collimated X-ray radiation corresponding to the desired pattern. The preferred method was one in which exposed polymer was dissolved to expose the substrate. The unexposed regions of the resist remained intact to produce a fine image with a resolution<0.25 $\mu$m. The integrity of the unexposed film in the area surrounding the exposed image remained intact, with no bubbles, cracks, or the like. Preferred developers were nitroalkanes and nitrocycloalkanes, most preferably 2-nitropropane and nitromethane.

The preferred development technique depended on whether the features in the image were "large" or "fine." In this context, "large" features are those larger than about 1 $\mu$m, while "fine" features are those smaller than about 1 $\mu$m.

Preferred development procedure for large features:

1) The exposed wafer was washed for 30 seconds in a petri dish with a solution of 100 mL nitropropane and 0.75 mL nitromethane.
2) The wafer was dried with compressed air for 30 seconds.
3) The wafer was washed with isopropyl alcohol for 30 seconds to remove fragments of resist.
4) The wafer was baked at 50° C. for 15 minutes.

Preferred development procedure for fine features:

1) The exposed wafer was washed in a petri dish for 3 seconds with 100 mL nitropropane.
2) The wafer was dried with compressed air for 30 seconds.
3) The wafer was washed with isopropyl alcohol for 30 seconds to remove fragments of resist.
4) Steps 1–3 were repeated a second time.
5) The wafer was baked at 50° C. for 15 minutes.

Resist Sensitivity. Of the four co-polymers that were soluble in nitromethane, PHS exhibited the best film-forming qualities, uniformity, clarity, and thickness under the development conditions described above. PHS was spun onto 4-inch (10 cm) silicon wafers in films about 1–2 $\mu$m thick. The wafers were then exposed without a mask with a broad (10×50 mm), collimated X-ray beam with wavelengths in the range 8 to 12 Å. Different PHS wafers were irradiated at 150, 500, and 1000 mJ/cm$^2$. Each was then developed under the preferred "large feature" development conditions described above. Degraded PHS resist material was completely removed from all exposed areas of the wafer. Further sensitivity studies under the same conditions found that PHS exhibited sensitivities at least down to 50 mJ/cm$^2$ for large area exposures. (It should be noted that 50 mJ/cm$^2$ was at the scanning limit of the particular exposure device used in these experiments, so the ultimate sensitivity may in fact be lower.)

Resist Resolution. Large features were obtained on PHS using a gold wire mesh mask irradiated at 250 mJ/cm$^2$ with collimated X-rays. A polarized light reflectance micrograph of the resulting features showed a complete loss of residual film around the desired image.

Figure 3:
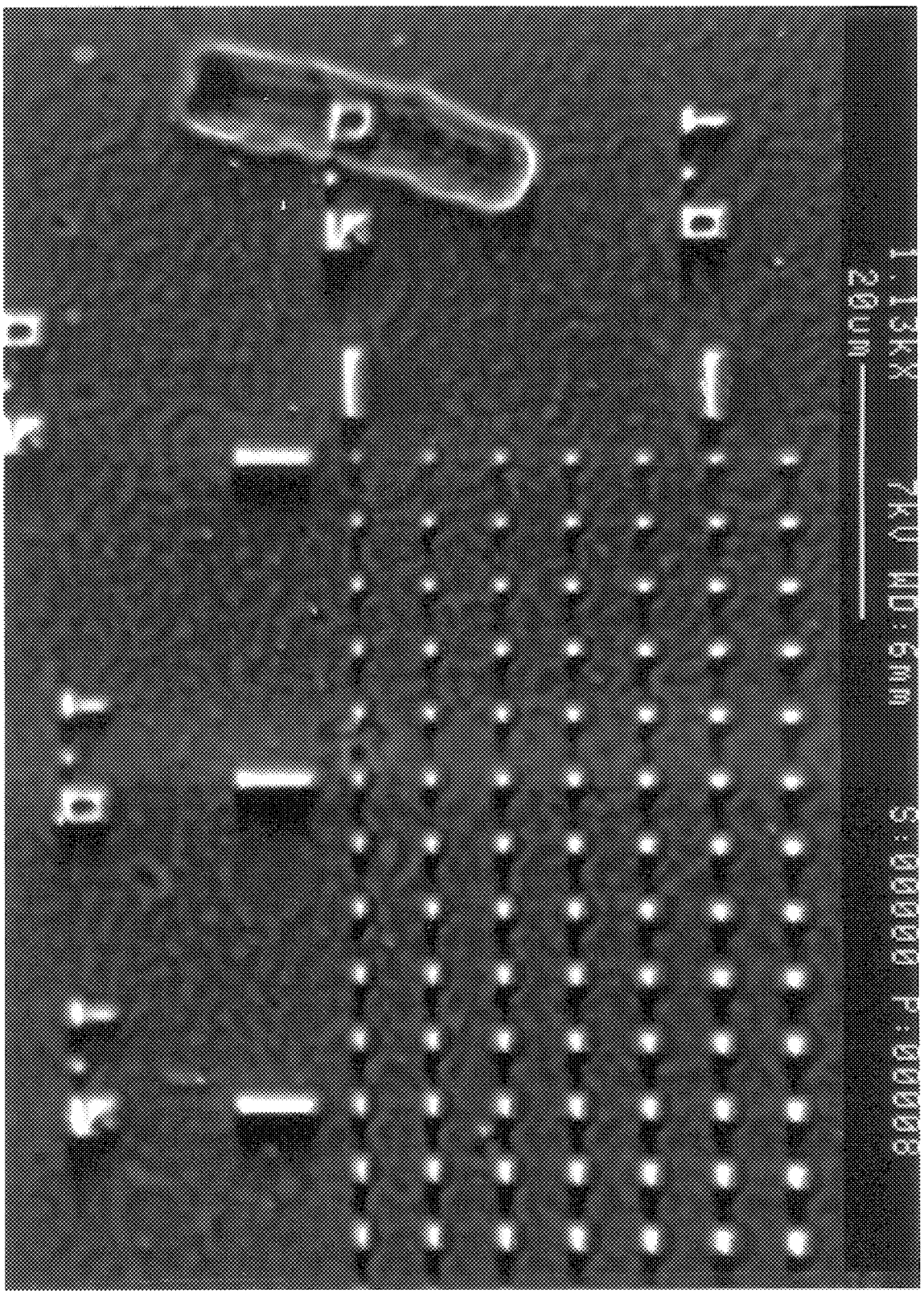
FIG. 3 depicts 0.25 μm features obtained for a developed poly (1,3-hexadiene sulfone) layer sputtered with a 100 Å layer of a gold/palladium mixture.
Figure 4:
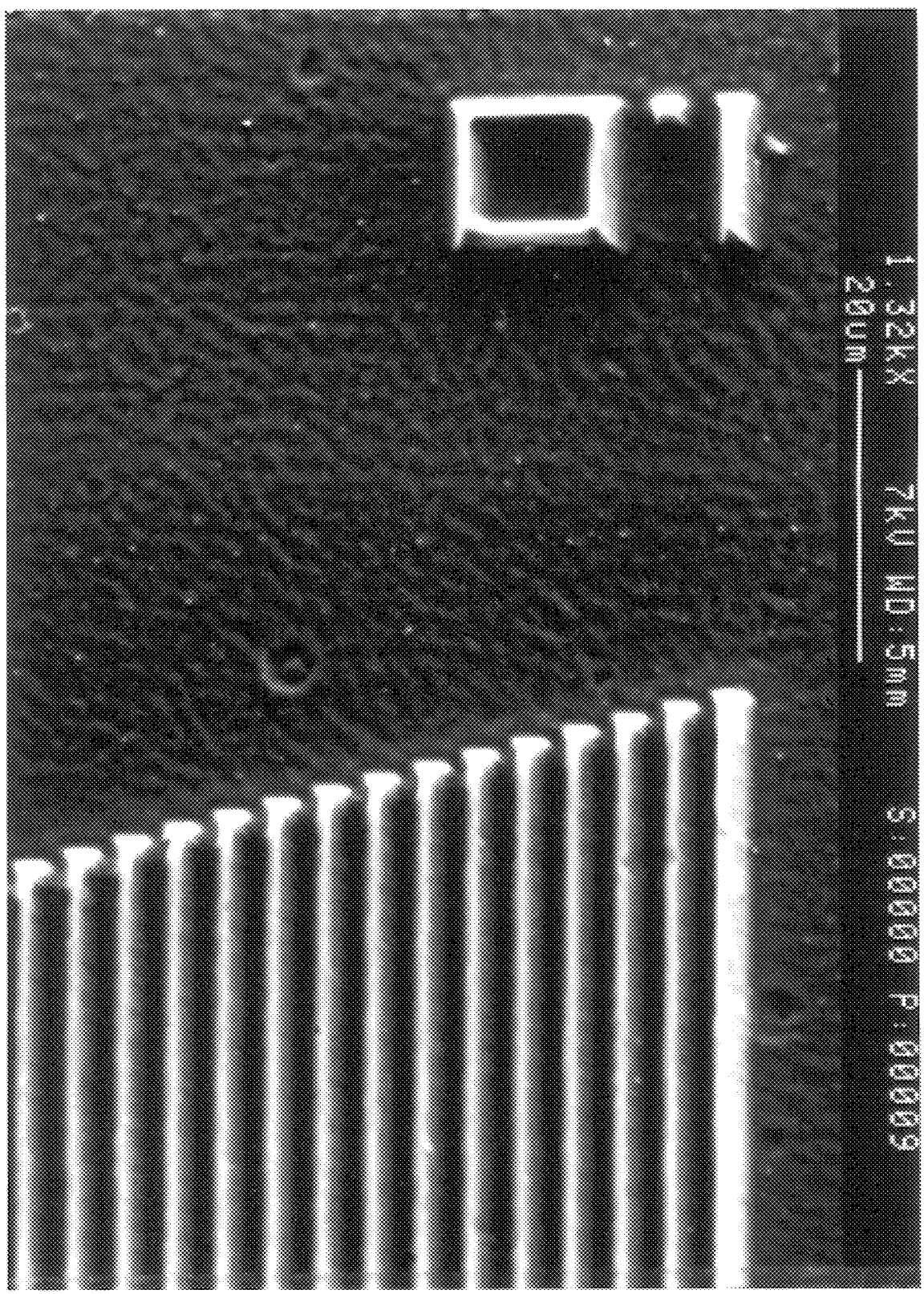
FIG. 4 depicts the preservation of edges and corners in a developed poly (1,3-hexadiene sulfone) layer sputtered with a 100 Å layer of a gold/palladium mixture.
Figure 5:
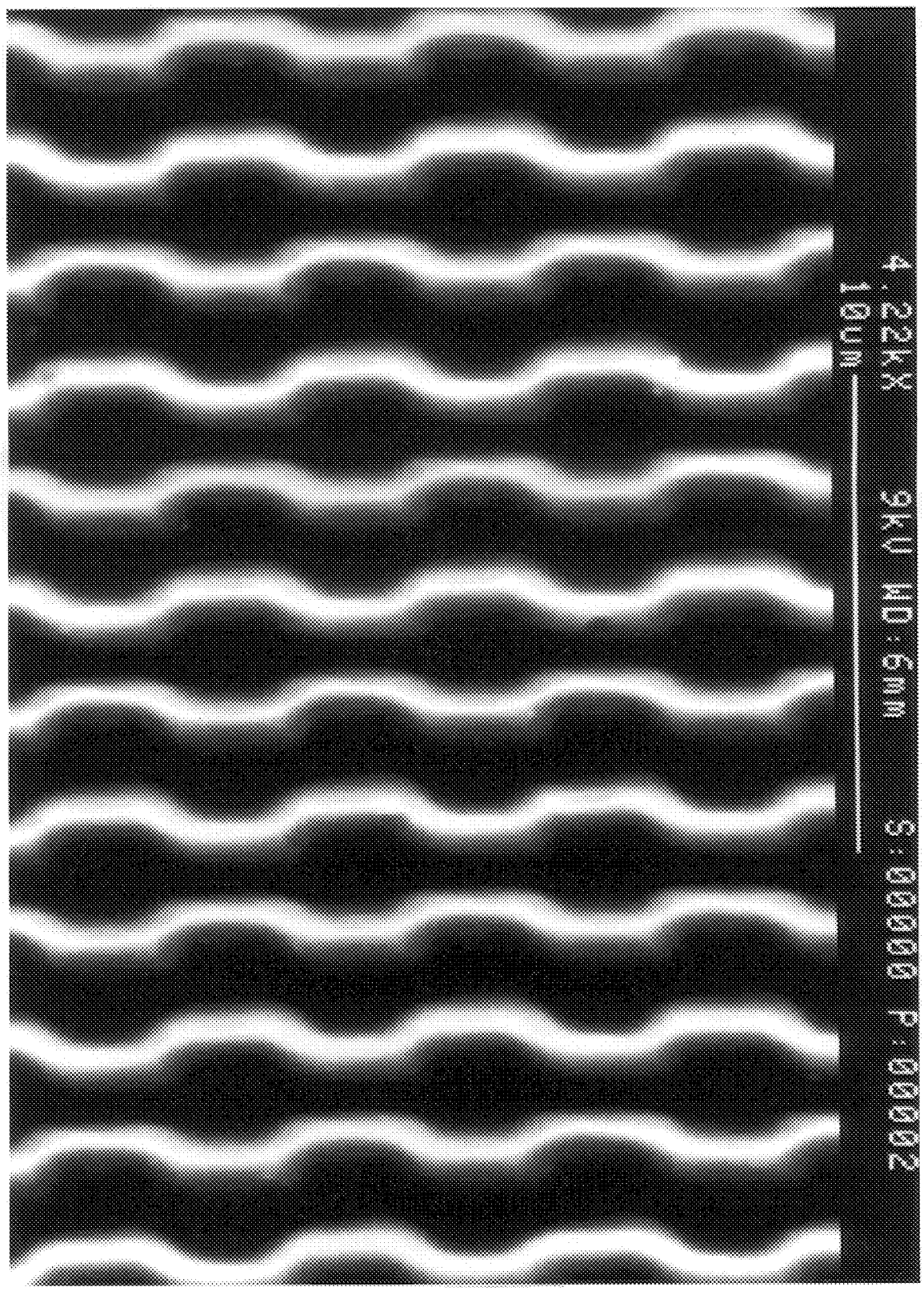
FIG. 5 depicts the repeatability of images developed in a poly (1,3-hexadiene sulfone) layer sputtered with a 100 Å layer of a gold/palladium mixture.
Figure 6:
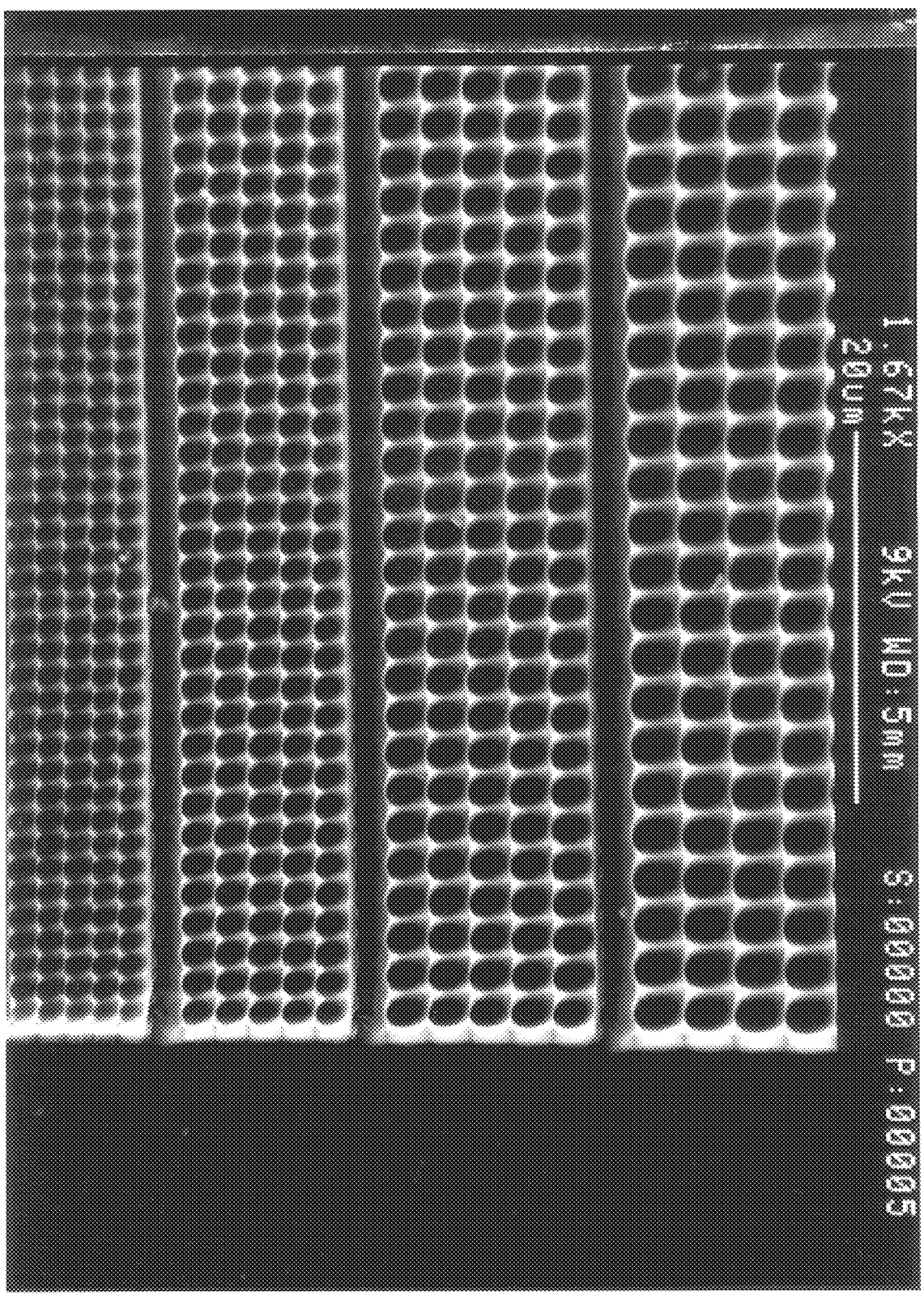
FIG. 6 depicts the removal of exposed resist both from around features, and from inside exposed features developed in a poly (1,3-hexadiene sulfone) layer sputtered with a 100 Å layer of a gold/palladium mixture.

An X-ray test mask was used to study smaller features, features less than 5 $\mu$m wide. A maximum exposure of 100 mJ/cm$^2$ was used, because it was difficult to prevent overexposure at higher energies. The fine-feature development process was used for these studies. FIGS. 4–6 depict scanning electron micrographs of the developed images after sputtering with a 100 Å layer of a gold/palladium mixture. As FIG. 3 demonstrates, a PHS resist could resolve features down to at least 0.25 $\mu$m, the smallest features on the mask used in that exposure. Image integrity was maintained, as shown in the scanning electron micrograph of FIG. 4. Edges and corners were both preserved, sustaining sharp profiles. Repeatability was high, as depicted in the scanning electron micrograph of FIG. 5. As shown in the scanning electron micrograph of FIG. 6, exposed areas were removed both from around features, and from inside exposed features.

Alternative Synthetic Routes

Unsaturated poly (diene sulfones) may be made by other synthetic routes if desired. Examples of such alternative routes include the oxidation of unsaturated polysulfides, ring-opening metathesis polymerization of cyclic olefins with sulfur dioxide, and polysulfone synthesis with sodium dithionite and dihaloalkanes.

The first alternative synthetic route is oxidation of unsaturated polysulfides. Polysulfides, in turn, may be synthesized by several different reactions, including the following: (1) Reaction of dihaloalkanes with sodium sulfide. See T. Zhang et al., *J. Polym. Sci. A, Polym. Chem.*, 32, 1323 (1994). (2) Reaction of dihaloalkanes and dithiols in the presence of a quaternary ammonium halide catalyst. See T. Zhang et al., *J. Polym. Sci. A, Polym. Chem.*, 32, 1323 (1994). (3) Reaction of dithiols with diolefins in the presence of a radical initiator. See C. S. Marvel et al., *J. Amer. Chem. Soc.*, 55, 775 (1948). (4) Radical polymerization of diacyldisulfides as inifer. See T. Otsu., *J. Polym. Sci*, 21, 559 (1956). (5) Ring-opening polymerization of cyclic sulfides or disulfides in the presence of cationic initiators. See J. K. Stille et al., *J. Polym. Sci. A-1*, 5, 273 (1967). By using unsaturated monomers in the starting materials, an unsaturated polysulfide will result from any of the above reactions. The polysulfide may then be oxidized to the polysulfone with peroxides, peroxyacids, or other oxidizing agents.

The second alternative synthetic route is the ring-opening metathesis polymerization of cyclic olefins with sulfur dioxide. In the presence of an organometallic catalyst such as a titanocyclobutane, a conjugated cyclic olefin may react with sulfur dioxide to copolymerize to form unsaturated polysulfones.

A third alternative synthetic route is synthesis from sodium dithionite and dihaloalkanes. Saturated polysulfones have been obtained in small yields by the reaction of sodium dithionite with dibromoalkanes. See E. Wellisch et al., *J. Polym. Sci., Polym. Lett.*, 2, 35 (1964). Unsaturated polysulfones may be prepared by an analogous route using an unsaturated dibromoalkane starting material in lieu of the dibromoalkane.

The entire disclosures of all references cited in the specification are hereby incorporated by reference in their entirety. In the event of an otherwise irresolvable conflict, however, the present specification shall control.

We claim:

1. Poly (1,3-hexadiene sulfone).
2. Poly (1,3-hexadiene sulfone) as recited in claim 1, wherein said poly (1,3-hexadiene sulfone) has a molecular weight between about 30,000 and about 150,000.

* * * * *